(12) United States Patent
Nozaki et al.

(10) Patent No.: US 12,191,063 B2
(45) Date of Patent: Jan. 7, 2025

(54) REACTOR

(71) Applicant: Alps Alpine Co., Ltd., Tokyo (JP)

(72) Inventors: Yoshiaki Nozaki, Tokyo (JP); Yasuhiro Ikarashi, Miyagi-ken (JP); Mitsuo Aratono, Tokyo (JP)

(73) Assignee: ALPS ALPINE CO., LTD., Tokyo (JP)

( * ) Notice: Subject to any disclaimer, the term of this patent is extended or adjusted under 35 U.S.C. 154(b) by 629 days.

(21) Appl. No.: 17/538,364

(22) Filed: Nov. 30, 2021

(65) Prior Publication Data

US 2022/0093308 A1 Mar. 24, 2022

Related U.S. Application Data

(63) Continuation of application No. PCT/JP2020/011740, filed on Mar. 17, 2020.

(30) Foreign Application Priority Data

Jun. 3, 2019 (JP) .................................. 2019-103755

(51) Int. Cl.
| | |
|---|---|
| *H01F 27/28* | (2006.01) |
| *G01R 19/00* | (2006.01) |
| *G01R 33/09* | (2006.01) |
| *H01F 17/06* | (2006.01) |
| *H01F 27/06* | (2006.01) |
| *H01F 27/29* | (2006.01) |

(52) U.S. Cl.
CPC ....... *H01F 17/062* (2013.01); *G01R 19/0092* (2013.01); *G01R 33/09* (2013.01); *H01F 27/06* (2013.01); *H01F 27/29* (2013.01); *H01F 2027/065* (2013.01)

(58) Field of Classification Search
CPC ....................................................... H01F 27/29
USPC ............................................................ 336/229
See application file for complete search history.

(56) References Cited

U.S. PATENT DOCUMENTS

| | | | | |
|---|---|---|---|---|
| 2,436,636 | A | * | 2/1948 | D Entremont .......... H01F 38/30 336/213 |
| 5,012,218 | A | * | 4/1991 | Haug ................... G01R 15/181 336/174 |

(Continued)

FOREIGN PATENT DOCUMENTS

| | | |
|---|---|---|
| JP | 2001-305163 | 10/2001 |
| JP | 2010-272772 | 12/2010 |

(Continued)

OTHER PUBLICATIONS

International Search Report from corresponding international application No. PCT/JP2020/011740, 4pp., Jun. 9, 2020.

*Primary Examiner* — Ronald Hinson
(74) *Attorney, Agent, or Firm* — Crowell & Moring LLP

(57) ABSTRACT

A reactor includes a toroidal coil including a winding wound to have an annular outer shape, a bus bar electrically connected to one end of the winding, and a current sensor that measures electric current flowing through the bus bar. The bus bar includes a crossing passing through a central area including an area inside an internal surface of the annular outer shape and an area in which the area extends along a central axis of the annular outer shape, and the current sensor measures electric current flowing through the crossing.

7 Claims, 12 Drawing Sheets

(56) References Cited

U.S. PATENT DOCUMENTS

| | | | | |
|---|---|---|---|---|
| 5,017,859 A | * | 5/1991 | Engel | G01R 15/16 |
| | | | | 361/302 |
| 5,105,146 A | * | 4/1992 | Wolf | G01R 19/15 |
| | | | | 324/117 R |
| 2002/0017976 A1 | * | 2/2002 | Okamoto | H01F 27/027 |
| | | | | 336/229 |
| 2004/0201373 A1 | * | 10/2004 | Kato | G01R 15/181 |
| | | | | 324/117 R |
| 2008/0129436 A1 | * | 6/2008 | Feist | H01F 27/027 |
| | | | | 336/67 |
| 2010/0073898 A1 | * | 3/2010 | Colson | H05K 3/301 |
| | | | | 361/809 |
| 2013/0076476 A1 | * | 3/2013 | Fornasari | H01F 30/16 |
| | | | | 336/214 |
| 2013/0300404 A1 | | 11/2013 | Hebiguchi | |
| 2014/0160820 A1 | * | 6/2014 | McKinley | H01F 38/32 |
| | | | | 363/126 |
| 2015/0028852 A1 | * | 1/2015 | Pascal | G01R 35/005 |
| | | | | 324/117 R |
| 2018/0164346 A1 | * | 6/2018 | Götz | G01R 15/185 |
| 2020/0388436 A1 | * | 12/2020 | Sattel | H05K 1/18 |

FOREIGN PATENT DOCUMENTS

| | | |
|---|---|---|
| JP | 2013-222802 | 10/2013 |
| JP | 5544502 | 5/2014 |
| JP | 2015-198330 | 11/2015 |
| JP | 6-260341 | 1/2018 |

\* cited by examiner

REACTOR

CLAIM OF PRIORITY

This application is a Continuation of International Application No. PCT/JP2020/011740 filed on Mar. 17, 2020, which claims benefit of priority to Japanese Patent Application No. 2019-103755 filed on Jun. 3, 2019. The entire contents of each application noted above are hereby incorporated by reference.

BACKGROUND

1. Field of the Disclosure

The present disclosure relates to reactors, and in particular, to a current-sensor integrated reactor.

2. Description of the Related Art

Japanese Unexamined Patent Application Publication No. 2010-272772 discloses a reactor in which a current sensor can be fixed to a coil using a component of the reactor in assembling the reactor. This reactor includes a coil comprised of a winding, a core in the coil, a current sensor mounted to the winding to detect electric current flowing through the coil, and a resin portion covering at least part of the outer periphery of the coil. The reactor is configured such that the current sensor is integrated with the resin portion. This configuration does not need a component for mounting the current sensor in addition to the components of the reactor and does not need the process of mounting the current sensor in addition to an assembly process for the reactor itself in mounting the current sensor.

In the reactor disclosed in Japanese Unexamined Patent Application Publication No. 2010-272772, a Hall-element type current sensor is disposed around a winding end to measure electric current flowing through the winding end with the current sensor. If the detecting element of the current sensor is a magnetism detecting element that detects magnetism, such as a Hall element type, the magnetism detecting element is susceptible to the influence of a disturbance magnetic field. In particular, if the magnetism detecting element is a magnetoresistive sensor, it has high detection sensitivity but is susceptible to the influence of a disturbance magnetic field. If the reactor is a toroidal coil, leakage flux due to the induction field from the coil can serve as a disturbance magnetic field for the detecting element.

SUMMARY

The present invention provides a reactor including a toroidal coil and a current sensor that measures electric current flowing through its winding and having a structure in which the detecting element of the current sensor is unsusceptible to the influence of a disturbance magnetic field.

A reactor according to an aspect of the present invention includes a toroidal coil including a winding wound to have an annular shape; a bus bar electrically connected to one end of the winding, and a current sensor that measures electric current flowing through the bus bar. The bus bar includes a crossing passing through a central area, wherein the central area includes an inner area inside an internal surface of the annular shape and that extends along a central axis of the annular shape. The current sensor is disposed in the central area to measure electric current flowing through the crossing.

The induction field created by electric current flowing through the winding cancel each other in the central area of the reactor. For this reason, even if the amount of electric current flowing through the winding increases, the disturbance magnetic field coming from the toroidal coil is unlikely to increase. Accordingly, a reactor including a current sensor capable of correctly measuring electric current even positioned in the vicinity of the reactor can be provided by disposing the current sensor in the central area to measure electric current flowing through the crossing of the bus bar.

DESCRIPTION OF THE EXEMPLARY EMBODIMENTS

Embodiments of the present invention will be described hereinbelow with reference to the drawings.

Figure 1:
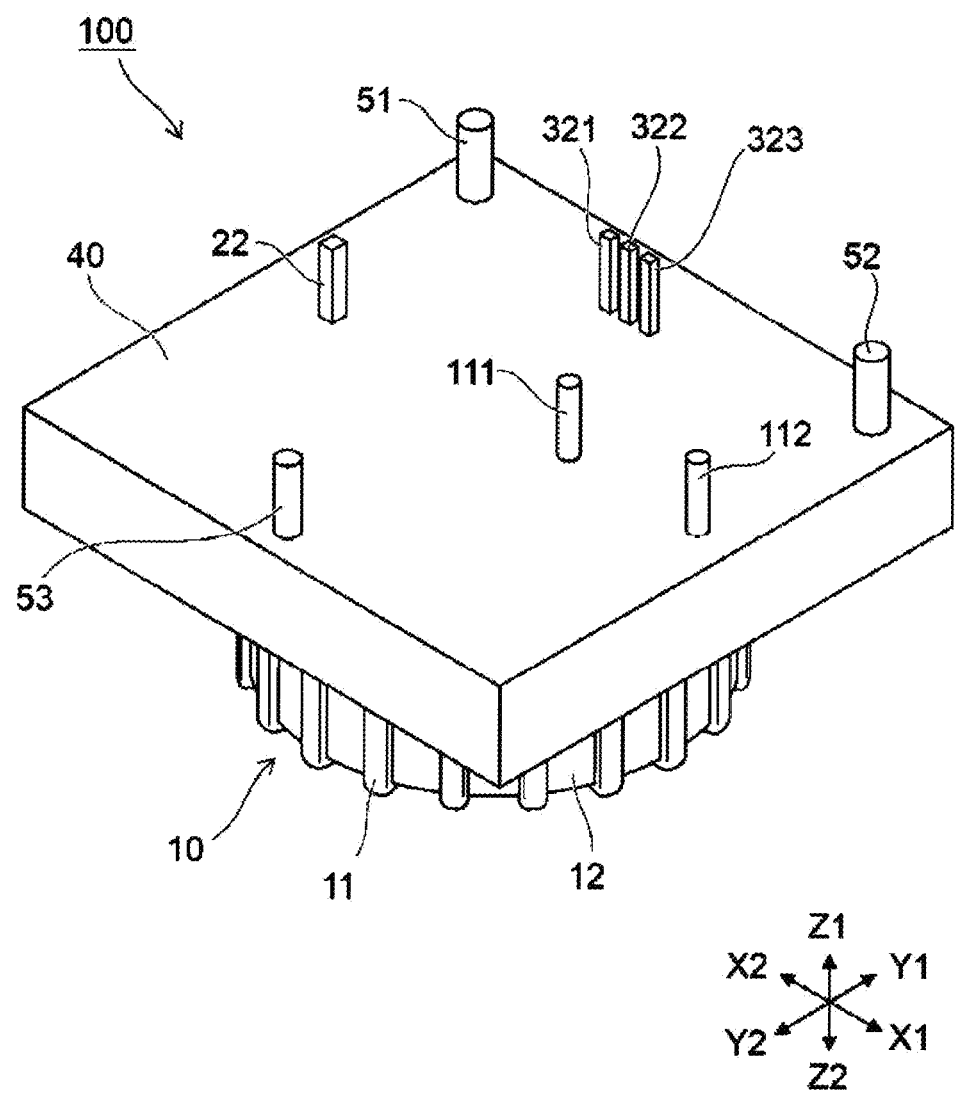
FIG. 1 is an explanatory diagram illustrating the appearance of a reactor according to a first embodiment of the present invention.
Figure 2:
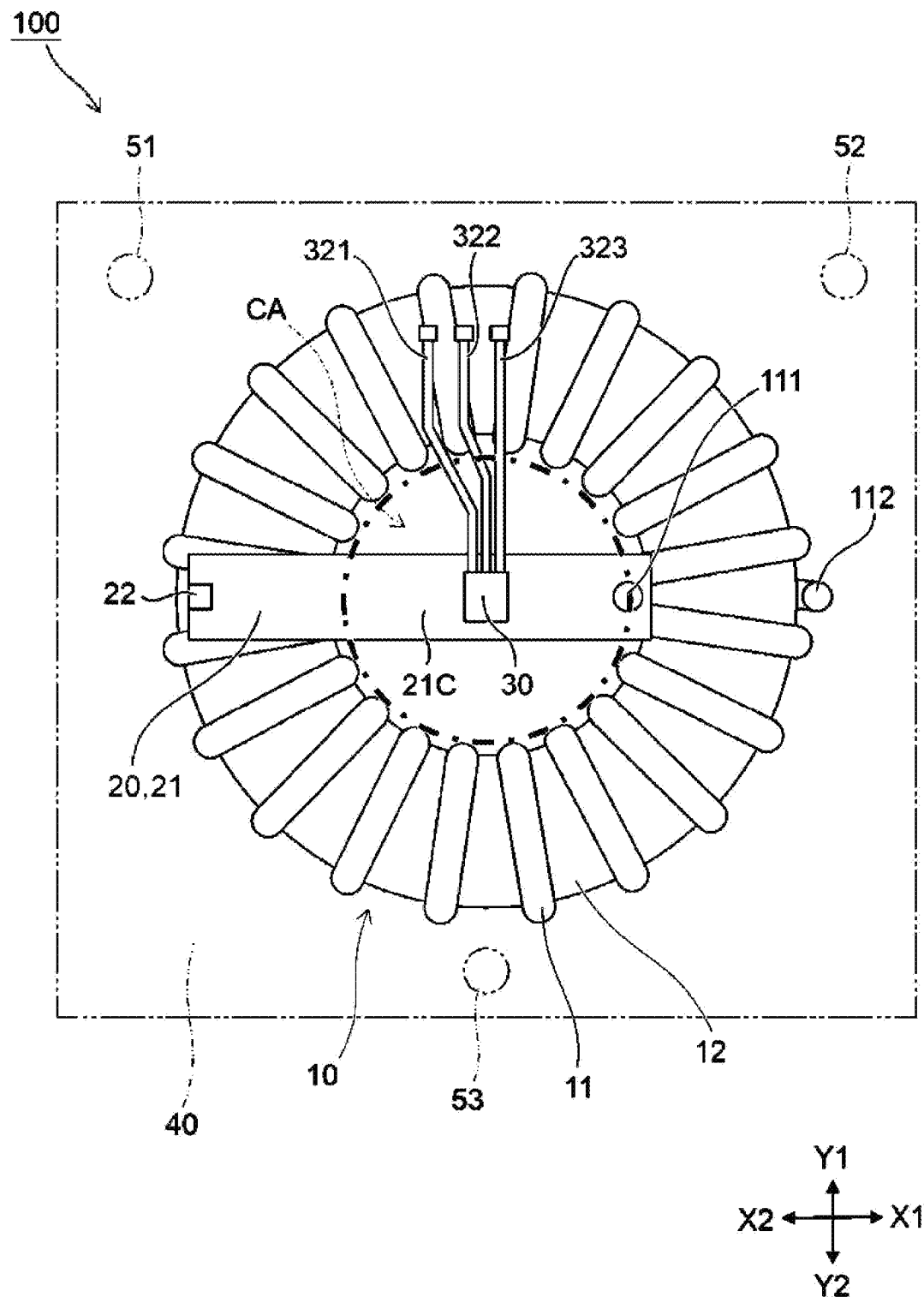
FIG. 2 is an explanatory diagram illustrating the structure of the reactor according to the first embodiment of the present invention seen in the Z-direction.
Figure 3:
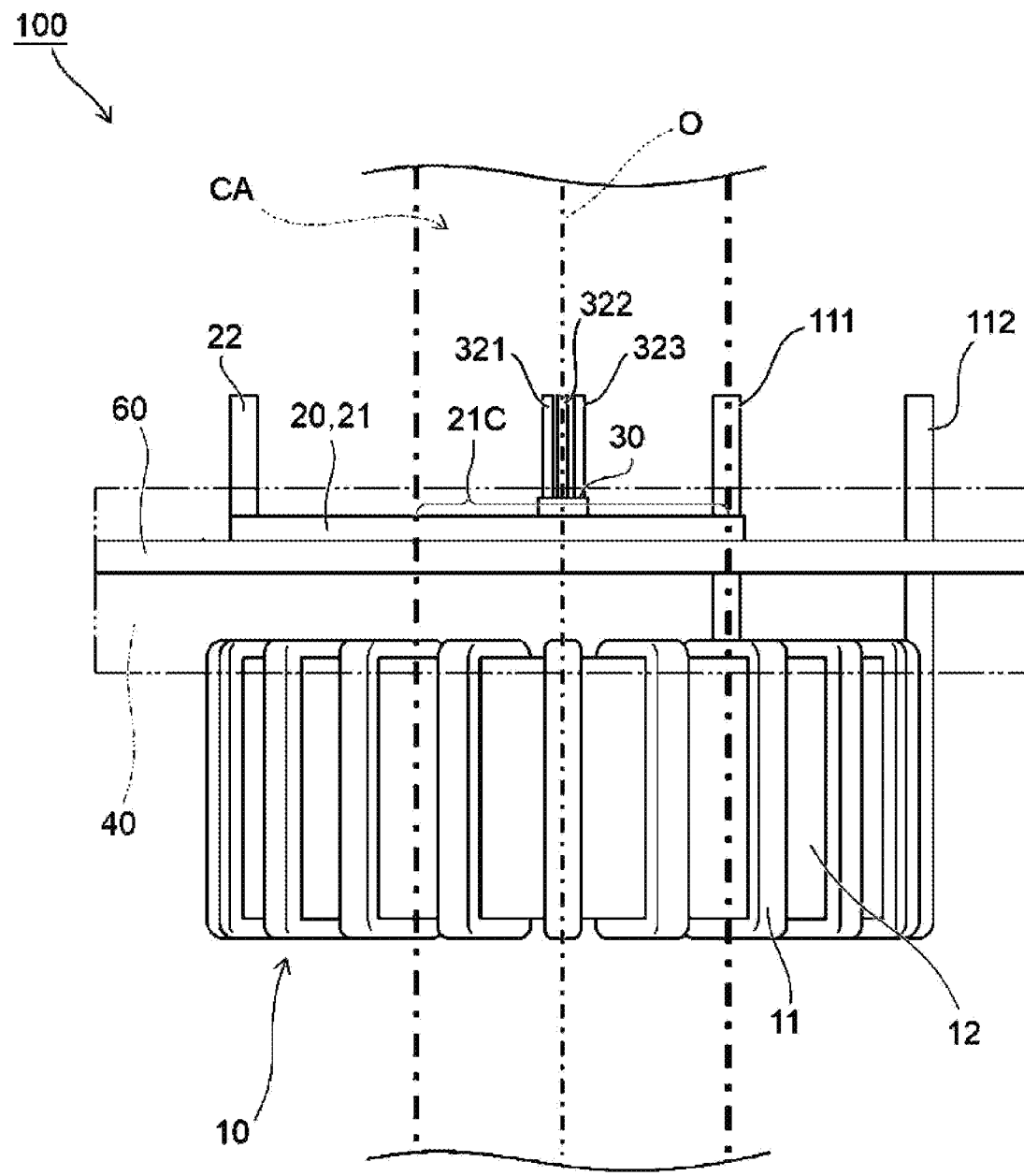
FIG. 3 is an explanatory diagram illustrating the structure of the reactor according to the first embodiment of the present invention seen in the Y-direction.
Figure 3:
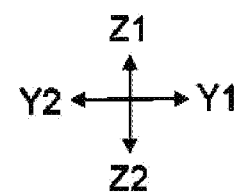
Figure 4:
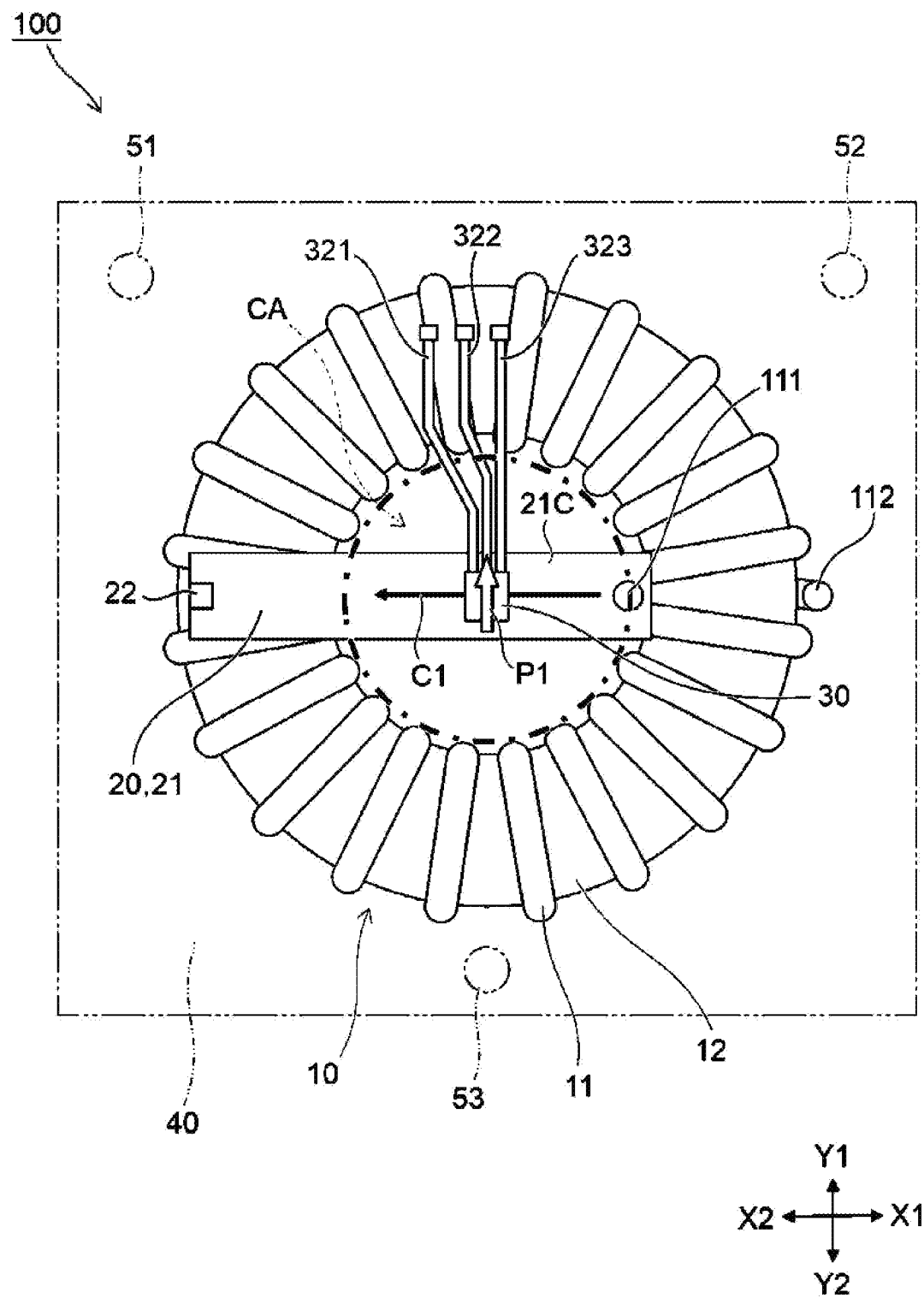
FIG. 4 is an explanatory diagram illustrating, in outline, electric current measurement with the current sensor of the reactor according to the first embodiment of the present invention seen in the Z-direction.
Figure 5:
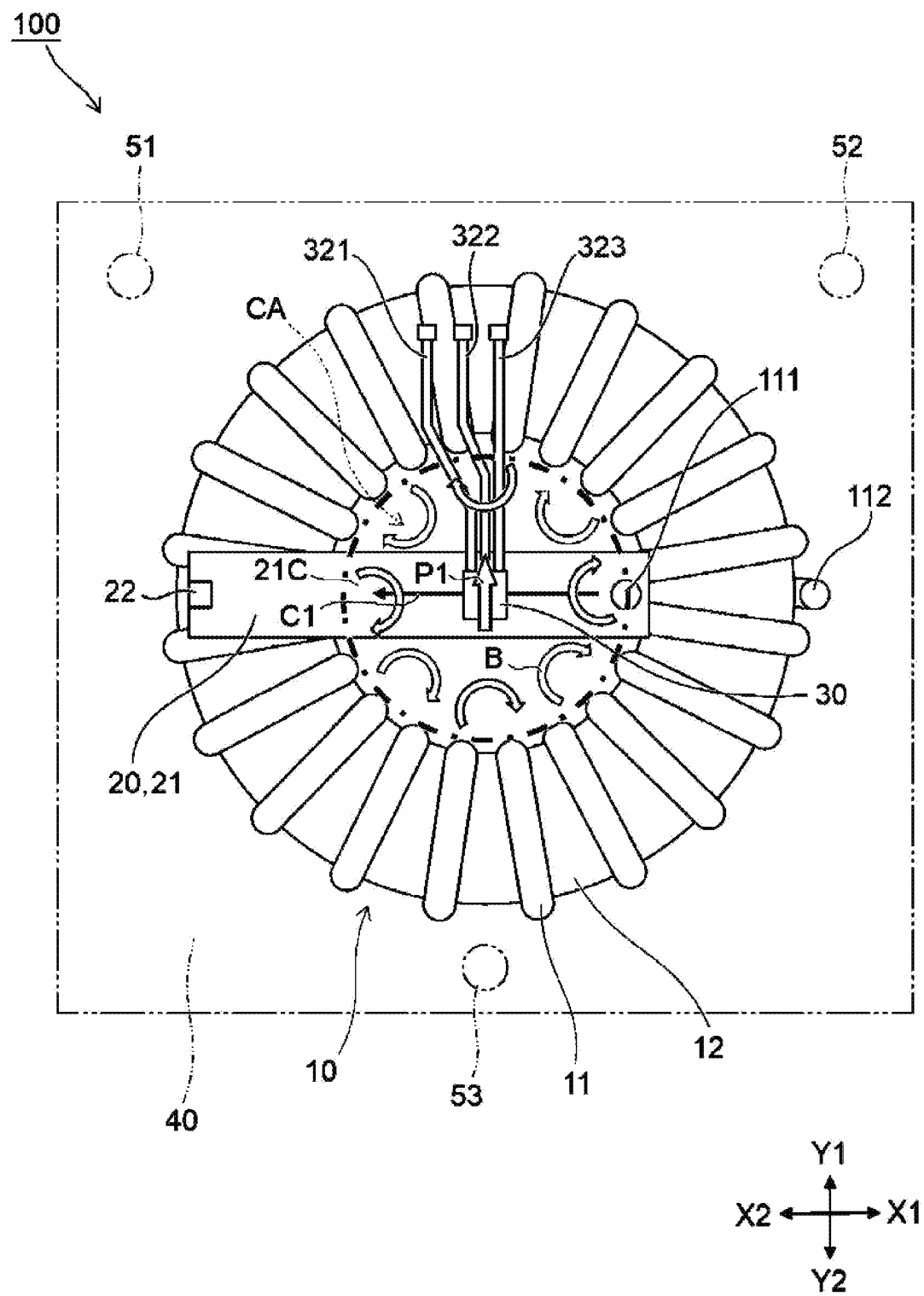
FIG. 5 is an explanatory diagram illustrating, in outline, the electric current measurement by the current sensor of the reactor according to the first embodiment of the present invention, seen in the Z-direction, together with the leakage fluxes coming from the toroidal coil.

FIG. 1 is an explanatory diagram illustrating the appearance of a reactor according to a first embodiment of the present invention. FIG. 2 is an explanatory diagram illustrating the structure of the reactor according to the first embodiment of the present invention seen in the Z-direction. FIG. 3 is an explanatory diagram illustrating the structure of the reactor according to the first embodiment of the present invention seen in the Y-direction. In FIGS. 2 and 3, the base is indicated by a two-dot chain line, and the structure covered by the base is seen through so that the internal structure can easily be comprehended. FIG. 4 is an explanatory diagram illustrating, in outline, electric current measurement with the current sensor of the reactor according to the first embodiment of the present invention seen in the Z-direction. FIG. 5 is an explanatory diagram illustrating, in outline, the electric current measurement by the current sensor of the reactor according to the first embodiment of the present invention, seen in the Z-direction, together with the disturbance magnetic field coming from the toroidal coil.

As shown in FIGS. 1 to 3, the reactor 100 may include a toroidal coil 10 including a winding 11 wound to have an annular outer shape. When electric current flows through the winding 11, magnetic flux is generated. However, the generated magnetic flux is relatively unlikely to have influence on the outside because of the annular outer shape. The toroidal coil 10 further includes a toroidal core 12 around which the winding 11 winds. The inductance of the toroidal coil 10 can be changed by changing the magnetic permeability $\mu$ of the toroidal core 12.

One end 111 of the winding 11 of the toroidal coil 10 is electrically connected to a bus bar 20. As shown in FIGS. 2 and 3, the bus bar 20 includes a plate-like portion 21 having a principal surface whose normal is along the Z1-Z2 direction and a connecting portion 22 provided at one end (on the X2 side in the X1-X2 direction) of the plate-like portion 21 and extending to the Z1 side in the Z1-Z2 direction. The plate-like portion 21 has a through-hole in the thickness direction at part thereof (specifically, part of the plate-like portion 21 on the X1 side in the X1-X2 direction). The end 111 of the winding 11 of the toroidal coil 10 passes through the through-hole to electrically connect to the bus bar 20.

The bus bar 20 includes a crossing 21C passing through a central area CA (indicated by the one-dot chain line in FIGS. 2 and 3) formed of an area inside the internal surface of the annular shape of the toroidal coil 10 and an area in which the area extends along the central axis O of the annular shape (Z1-Z2 direction).

As shown in FIG. 4, a current sensor 30 for measuring electric current flowing through the bus bar 20 measures an electric current Cl flowing through the crossing 21C. The current sensor 30 of the reactor 100 according to an aspect of the present invention includes a magnetism detecting element that measures an induction field created by the electric current Cl flowing through the crossing 21C. In an example, the magnetism detecting element is a magnetoresistive sensor. Specific examples include a giant magnetoresistive sensor and a tunnel magnetoresistive sensor.

Current sensors including such a magnetoresistive sensor can indirectly measure electric current flowing through the winding with high accuracy even with a compact size. However, magnetoresistive sensors are susceptible to the influence of a disturbance magnetic field. The toroidal coil 10 has a structure in which the magnetic flux created by electric current flowing through the coil (winding 11) is relatively unlikely to leak. However, if the magnetoresistive sensor has high sensitivity, and the turn density of the winding 11 is low, there is concern that the influence of leakage flux on the measurement as a disturbance magnetic field cannot be ignored.

For this reason, the current sensor 30 of the reactor 100 according to an aspect of the present invention is disposed so as to measure electric current Cl flowing through the crossing 21C of the bus bar 20, as shown in FIGS. 2 to 5. The crossing 21C is located in the central area CA formed of the internal surface of the annular shape of the toroidal coil 10 and the area inside the cylindrical surface of the internal surface extending in the Z1-Z2 direction. As shown in FIG. 5, leakage fluxes B coming from the winding 11 of the toroidal coil 10 cancel each other to decrease in the central area CA. FIG. 5 shows a state, as an example, in which counterclockwise leakage fluxes B are generated from the winding 11 inside the toroidal coil 10 as seen from the Z1 side to Z2 side in the Z1-Z2 direction. Since magnetic fluxes are generated from the individual windings 11 arranged on the internal surface of the annular shape of the toroidal coil 10, the leakage fluxes B in the X-Y in-plane direction cancel each other. Consequently, the intensity of the disturbance magnetic field in the X-Y in-plane direction decreases in the central area CA. This tendency is predominant in the center of the central area CA, that is, around the central axis O of the annular shape, especially reducing the influence of the disturbance magnetic field.

Accordingly, disposing the crossing 21C of the bus bar 20 so that the electric current Cl flows in the in-plane direction (specifically, the X1-X2 direction) of the plane (X-Y plane) whose normal is along the central axis O (Z1-Z2 direction) of the annular shape of the toroidal coil 10, the induction field created by the electric current Cl is directed in the X-Y in-plane direction (specifically, the Y1-Y2 direction) in the Z1-Z2 direction of the crossing 21C. The in the X-Y in-plane direction is unsusceptible to the influence of a disturbance magnetic field. For this reason, setting the detection axis P1 of the magnetism detecting element of the current sensor 30 in the X-Y in-plane direction (specifically in the Y1-Y2 direction) reduces the influence of the disturbance magnetic field on the electric current measurement with the current sensor 30.

As shown in FIG. 1, the reactor 100 according to an aspect of the present invention includes an insulative base 40 that fixes the toroidal coil 10 to the bus bar 20 together. In this embodiment, the base 40 is a molding that integrates the toroidal coil 10 and the bus bar 20, that is, fixes them so that the relative positions do no change. As shown in FIG. 3, the bus bar 20 is fixed on a supporting substrate 60 (on the Z1 side in the Z1-Z2 direction), and the current sensor 30 is fixed on the bus bar 20 (on the Z1 side in the Z1-Z2 direction). Thus, the supporting substrate 60 and the current sensor 30 are also fixed by the base 40. Part of the toroidal coil 10 (specifically part on the Z1 side in the Z1-Z2 direction) is embedded in the base 40. The base 40 can be formed by integral molding that performs plastic molding, with the current sensor 30 and so on placed on a mold.

As shown in FIG. 1, in this embodiment, the supporting substrate 60, the plate-like portion 21 of the bus bar 20, and the current sensor 30 are embedded in the base 40. The surface of the base 40 has electrical conductivity. Since the surface of the base 40 has electrical conductivity, the influence of a disturbance magnetic field caused by magnetic flux other than the leakage fluxes B generated from the toroidal coil 10 on the current sensor 30 can be reduced. In the viewpoint of stably reducing the disturbance magnetic field, it is preferable that at least the surface of the side of the base 40 (whose normal extends in the X-Y in-plane direction) have electrical conductivity. The surface of the base 40 may be given electrical conductivity by any method. Examples of the method include a wet process such as plating, a dry process such as sputtering, and application of electrically conductive paste.

One end 111 of the winding 11, the other end 112 of the winding 11, the connecting portion 22 of the bus bar 20, and wiring lines 321, 322, and 323 of the current sensor 30 protrude from the surface of the base 40 on the Z1 side in the Z1-Z2 direction. If these projecting electrically conductive members can be kept electrically isolated from one another, the surface of the base 40 on the Z1 side in the Z1-Z2 direction may have electrical conductivity.

Figure 6:
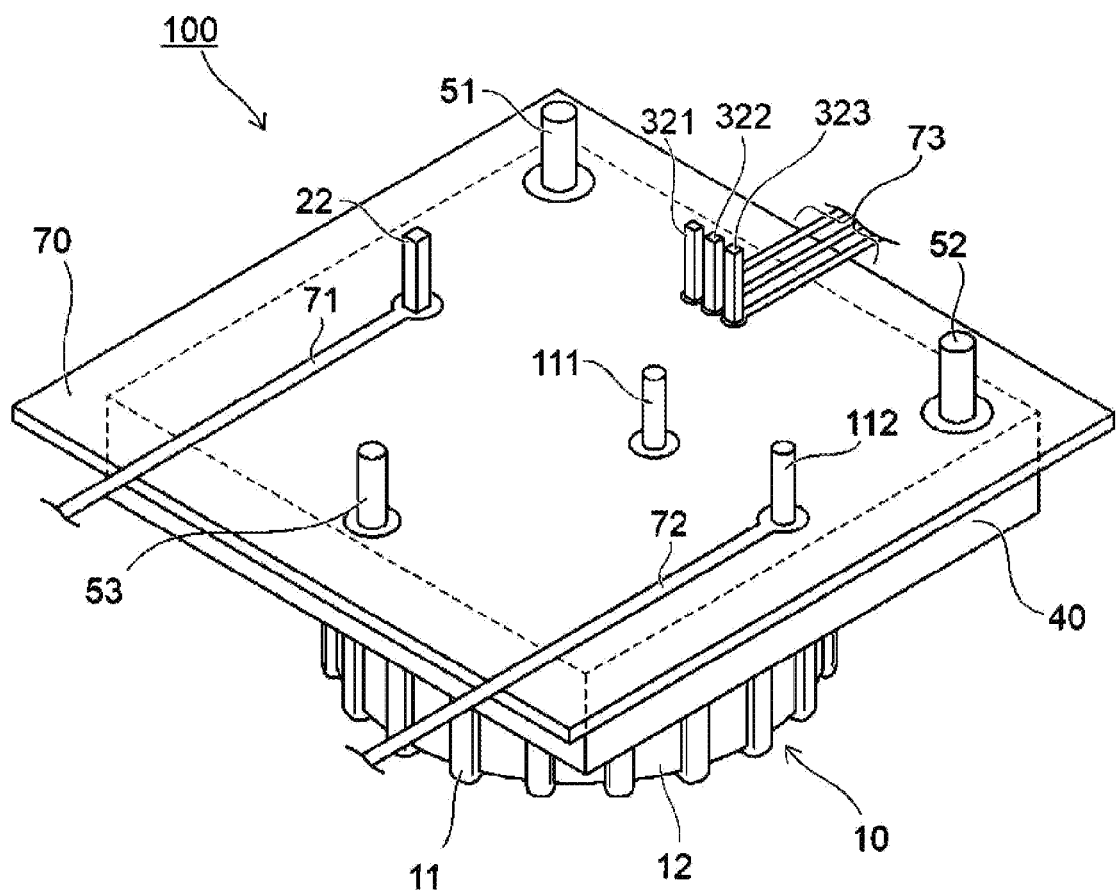
FIG. 6 is an explanatory diagram illustrating a state in which the reactor according to the first embodiment of the present invention is mounted on a printed board.

FIG. 6 is an explanatory diagram illustrating a state in which the reactor according to the first embodiment of the present invention is mounted on a printed board. As shown in FIG. 6, a printed board 70 is disposed on the Z1 side of the base 40 in the Z1-Z2 direction using three protrusions 51, 52, and 53 protruding on the Z1 side of the base 40 in the Z1-Z2 direction for positioning. The printed board 70 is provided with a wiring line 71 electrically connected to the connecting portion 22 of the bus bar 20, a wiring line 72 electrically connected to the other end 112 of the winding 11, and a group of wiring lines 73 electrically connected to wiring lines 321, 322, and 323 of the current sensor 30.

Thus, the reactor 100 according to an aspect of the present invention includes the current sensor 30, and the current sensor 30 is disposed so as to measure the electric current Cl flowing through the crossing 21C of the bus bar 20, although the footprint of the printed board 28 has the same size as that of the toroidal coil 10, and is therefore unsusceptible to the influence of the disturbance magnetic field caused by the leakage fluxes B coming from the toroidal coil 10. Moreover, since the current sensor 30 is embedded in the base 40 that fixes the bus bar 20 and the toroidal coil 10, and the surface of the base 40 has electrical conductivity, the influence of the disturbance magnetic field not from the toroidal coil 10 is also reduced appropriately.

Figure 7:
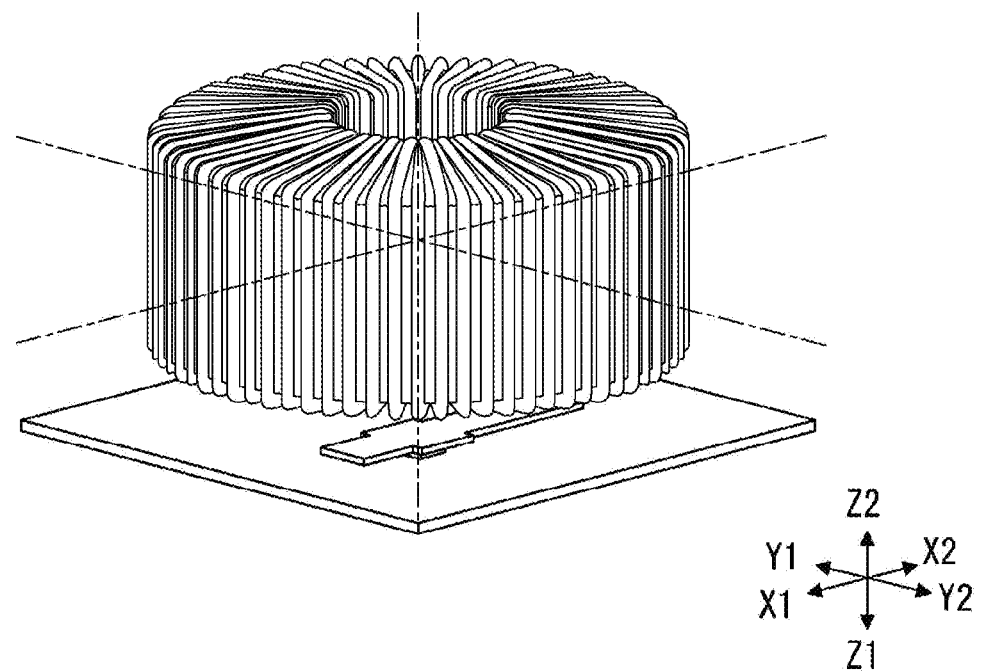
FIG. 7 is a layout drawing of the components at a simulation.
Figure 8:
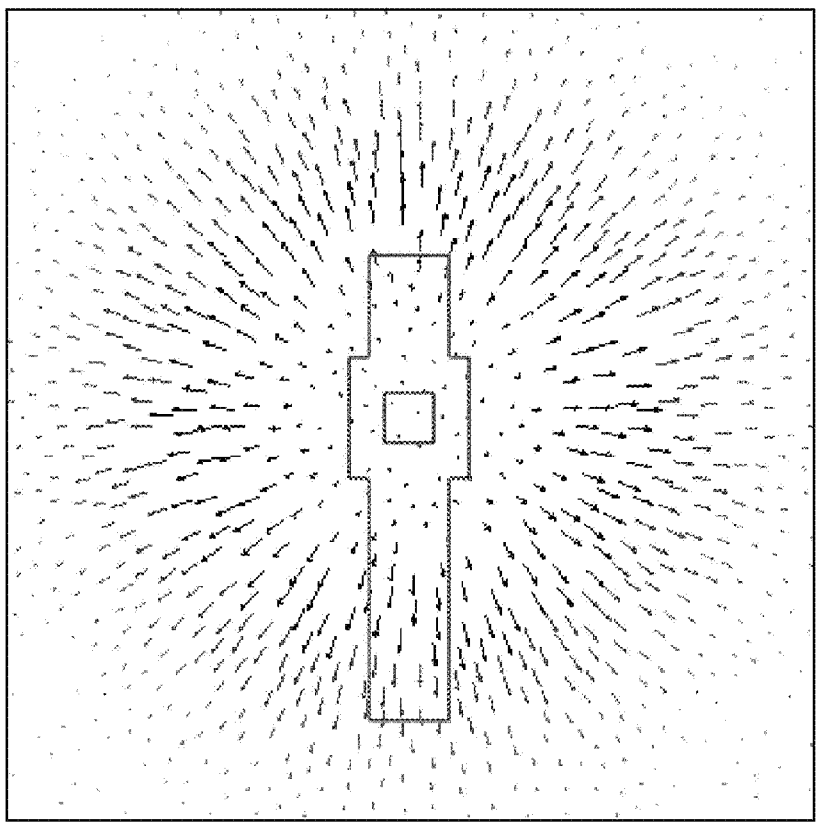
FIG. 8 is a diagram illustrating the result of the simulation, illustrating the vectors of leakage fluxes (an X-Y plan view)
Figure 8:
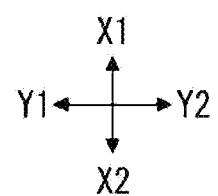
Figure 9:
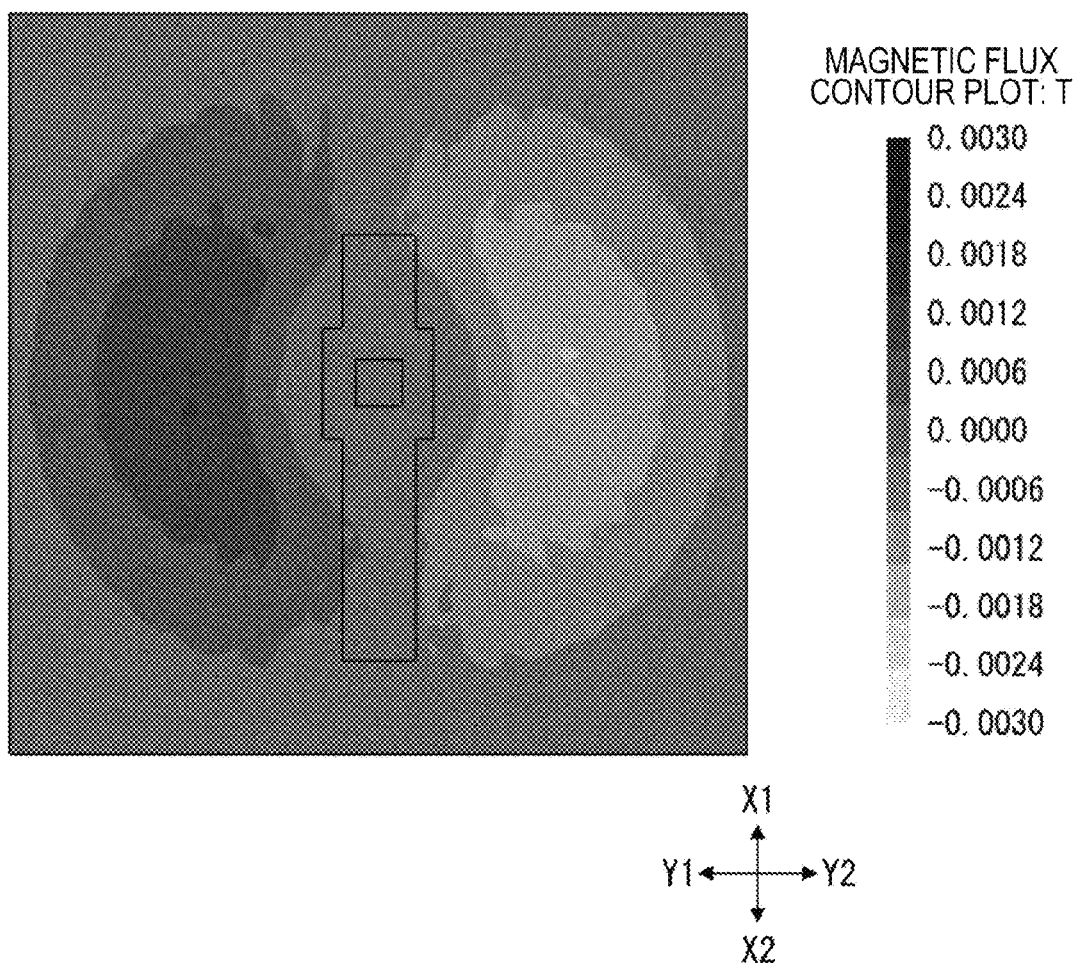
FIG. 9 is a contour figure showing the simulation result, illustrating the intensity of the leakage fluxes in the X1-X2 direction.
Figure 10:
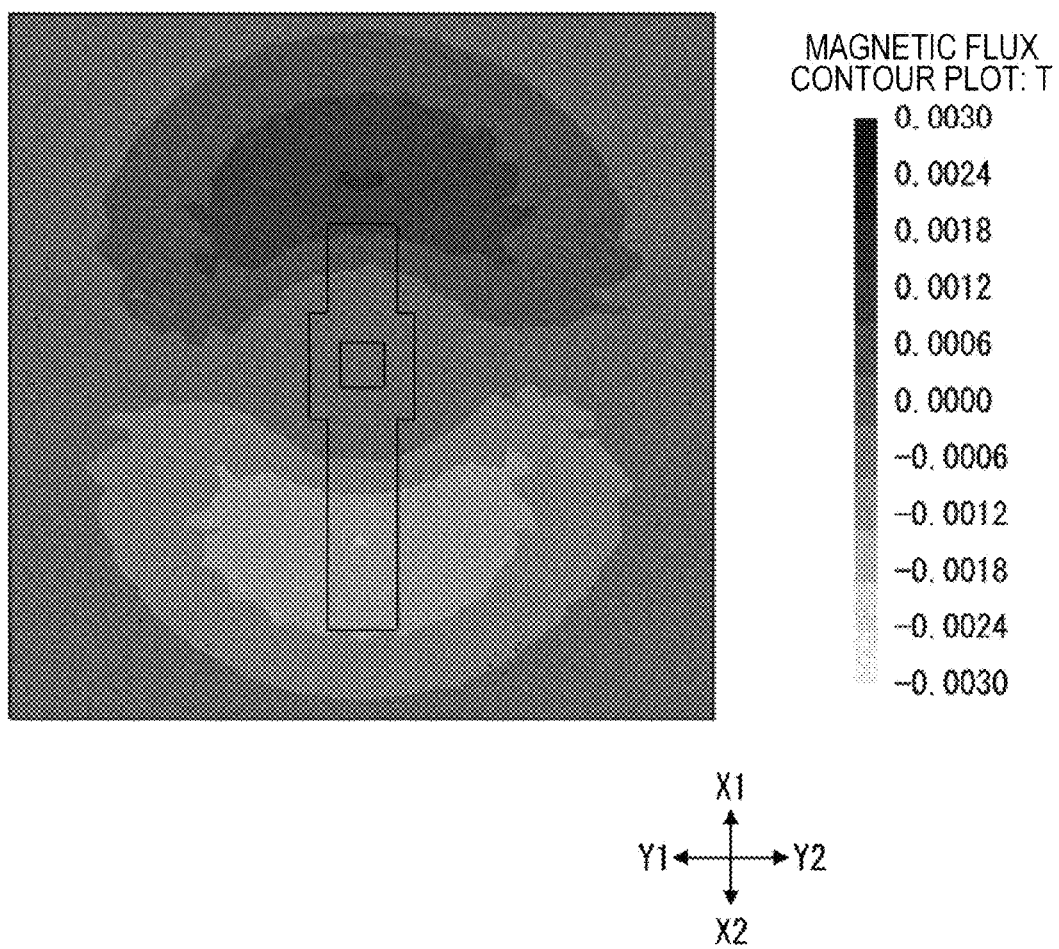
FIG. 10 is a contour figure showing the simulation result, illustrating the intensity of the leakage fluxes in the Y1-Y2 direction.
Figure 11:
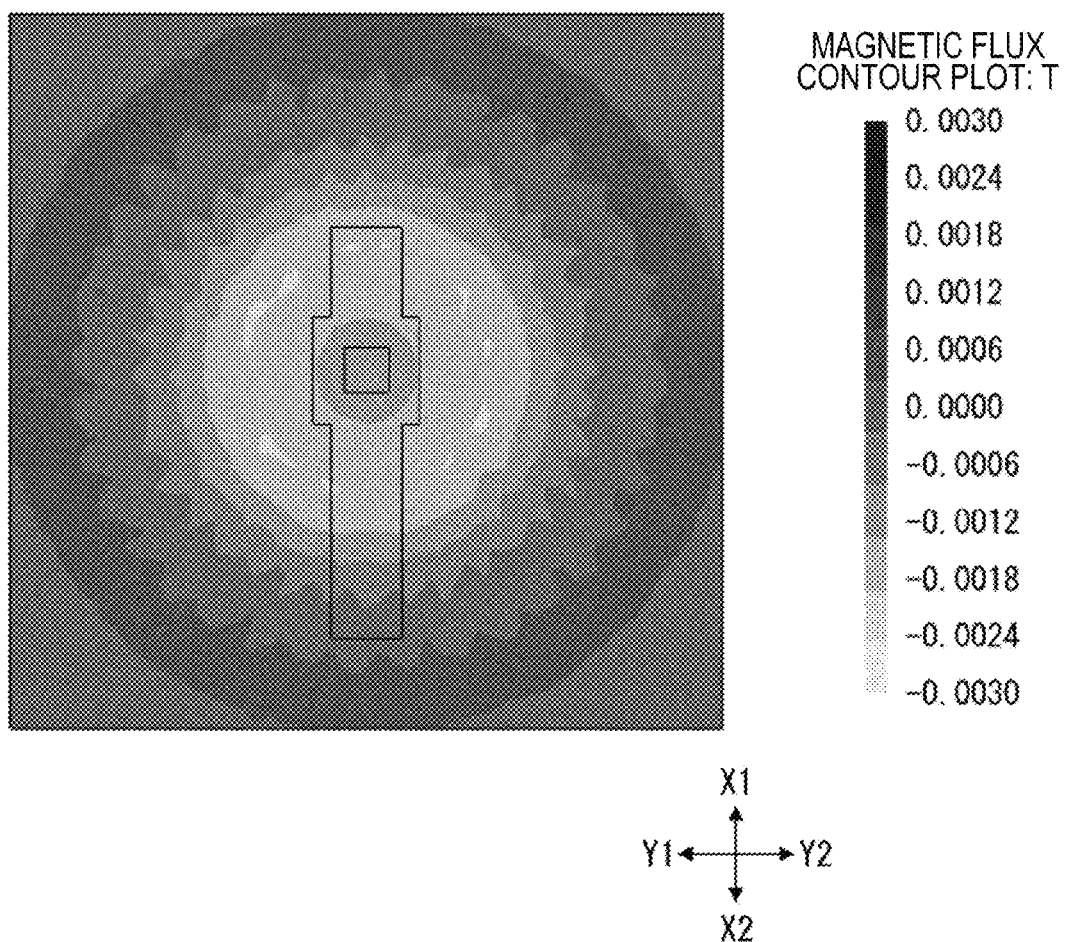
FIG. 11 is a contour figure showing the simulation result, illustrating the intensity of the leakage fluxes in the Z1-Z2 direction.
Figure 12A:
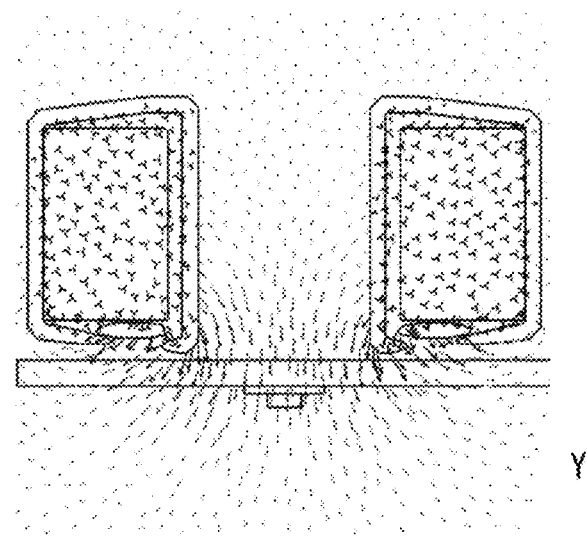
FIG. 12A is a diagram showing the simulation result, illustrating the vectors of the leakage fluxes (a cross-sectional view in an X-Z plane)
Figure 12B:
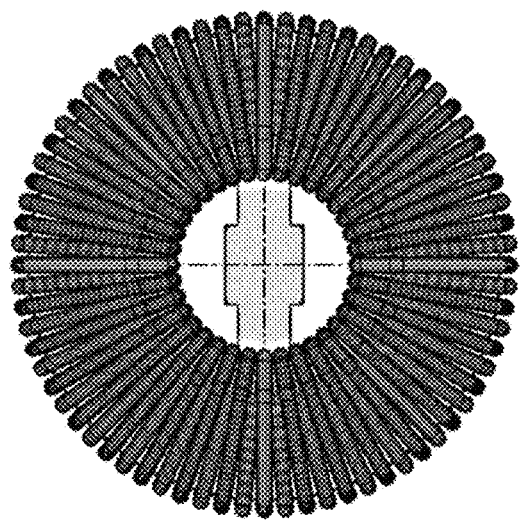
FIG. 12B is a layout drawing of the components in the simulation (seen from the Z2 side to the Z1 side in the Z1-Z2 direction)
Figure 12C:
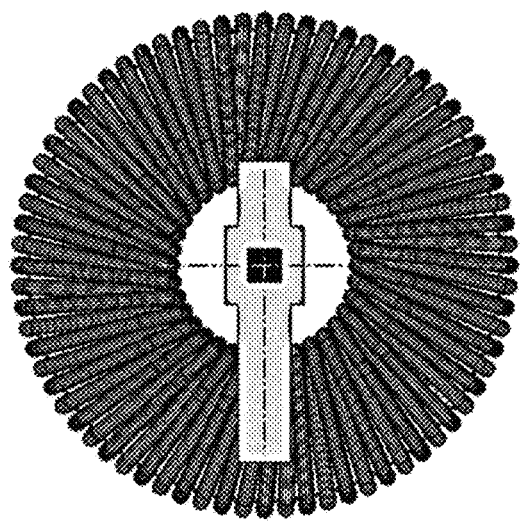
FIG. 12C is a layout drawing of the components in the simulation (seen from the Z1 side to the Z2 side in the Z1-Z2 direction).

The result of a simulation on the leakage fluxes B of the reactor 100 will be described hereinbelow. FIG. 7 is a layout drawing of the components at the simulation. FIG. 8 is a diagram illustrating the result of the simulation, illustrating the vectors of the leakage fluxes B (an X-Y plan view seen from the Z1 side to the Z2 side in the Z1-Z2 direction). FIG. 9 is a contour figure showing the simulation result, illustrating the intensity of the leakage fluxes B in the X1-X2 direction. FIG. 10 is a contour figure showing the simulation result, illustrating the intensity of the leakage fluxes B in the Y1-Y2 direction. FIG. 11 is a contour figure showing the simulation result, illustrating the intensity of the leakage fluxes B in the Z1-Z2 direction. FIG. 12A is a diagram showing the simulation result, illustrating the vectors of the leakage fluxes B (a cross-sectional view in an X-Z plane passing through the current sensor 30). FIG. 12B is a layout drawing of the components in the simulation (an X-Y plan view seen from the Z2 side to the Z1 side in the Z1-Z2 direction). FIG. 12C is a layout drawing of the components in the simulation (an X-Y plan view seen from the Z1 side to the Z2 side in the Z1-Z2 direction).

As shown in FIG. 7, the coordinates are defined, with the center of the toroidal coil 10 as the origin. The bus bar 20 is located on the Z1 side in the Z1-Z2 direction with respect to the toroidal coil 10, with the supporting substrate 60 therebetween, and the current sensor 30 is located on the Z1 side with respect to the bus bar 20 in the Z1-Z2 direction. As shown in FIG. 8, the distribution of the leakage fluxes B is basically symmetric about the central axis O of the toroidal coil 10. As shown in FIGS. 9 and 10, the intensities of the leakage fluxes B are not high in the X1-X2 direction and the Y1-Y2 direction. In particular, in the crossing 21C radially inside the toroidal coil 10 seen in the Z1-Z2 direction, the leakage fluxes B are weak in the X-Y in-plane direction, and the variations of the leakage fluxes B in the crossing 21C are particularly low. This shows that the induction field of the bus bar 20 can be measured under little influence of the leakage fluxes B by disposing the current sensor 30, whose detection axis P1 is in the X-Y in-plane direction, inside the crossing 21C.

As shown in FIGS. 11 and 12, the intensities of the leakage fluxes B in the crossing 21C are higher in the Z1-Z2 direction than in the X-Y in-plane direction. However, if the detection axis P1 of the current sensor 30 is in the X-Y in-plane direction, the disturbance magnetic field in the Z1-Z2 direction does not influence the measurement result. Accordingly, the current sensor 30 can measure the induction field of the bus bar 20 with little influence of the leakage fluxes B at any position in the Z1-Z2 direction inside the crossing 21C.

It is to be understood that the above embodiments are described for mere illustrative purposes and are not intended to limit the present invention. Accordingly, the elements disclosed in the embodiments include all design changes and equivalents within the technical scope of the present invention.

For example, the protrusions 51, 52, and 53 may part of the molding constituting the base 40 or may be components separate from the molding.

The reactor according to an embodiment of the present invention is unsusceptible to the influence of a disturbance magnetic field although it is compact and is suitably used when components are closely mounted on a printed board.

What is claimed is:

1. A reactor comprising:
   a toroidal coil including a winding wound to have an annular shape;
   a bus bar electrically connected to one end of the winding; and
   a current sensor that measures electric current flowing through the bus bar,
   wherein the bus bar includes a crossing passing through a central area, wherein the central area includes an area inside an internal surface of the annular shape and that extends along a central axis of the annular shape, and
   wherein the current sensor measures electric current flowing through the crossing.

2. The reactor according to claim 1, wherein the current sensor includes a magnetism detecting element that measures an induction field created by the electric current flowing through the crossing.

3. The reactor according to claim 2, wherein the magnetism detecting element comprises a magnetoresistive sensor.

4. The reactor according to claim 1, wherein the toroidal coil further includes a toroidal core around which the winding winds.

5. The reactor according to claim 1, further comprising an insulative base that fixes the toroidal coil and the bus bar together.

6. The reactor according to claim 5, wherein the base comprises a molding that integrates the toroidal coil with the bus bar.

7. The reactor according to claim 5,
   wherein the current sensor is embedded in the base, and
   wherein part of a surface of the base has electrical conductivity.

* * * * *